(12) United States Patent
Shinoda et al.

(10) Patent No.: US 10,859,912 B2
(45) Date of Patent: Dec. 8, 2020

(54) IMPRINT APPARATUS, IMPRINT METHOD, AND ARTICLE MANUFACTURING METHOD

(71) Applicant: CANON KABUSHIKI KAISHA, Tokyo (JP)

(72) Inventors: Ken-ichiro Shinoda, Utsunomiya (JP); Masahiro Tamura, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 98 days.

(21) Appl. No.: 16/044,864

(22) Filed: Jul. 25, 2018

(65) Prior Publication Data

US 2019/0033710 A1 Jan. 31, 2019

(30) Foreign Application Priority Data

Jul. 28, 2017 (JP) .................................. 2017-146802

(51) Int. Cl.
| | |
|---|---|
| *G03F 7/00* | (2006.01) |
| *B29C 43/58* | (2006.01) |
| *B29C 59/02* | (2006.01) |
| *G03F 9/00* | (2006.01) |
| *B82Y 40/00* | (2011.01) |
| *B82Y 10/00* | (2011.01) |
| *H01L 21/027* | (2006.01) |

(52) U.S. Cl.
CPC ............ *G03F 7/0002* (2013.01); *B29C 43/58* (2013.01); *B29C 59/022* (2013.01); *G03F 9/7042* (2013.01); *G03F 9/7084* (2013.01); *B29C 2059/023* (2013.01); *B82Y 10/00* (2013.01); *B82Y 40/00* (2013.01); *G03F 2009/005* (2013.01); *H01L 21/0275* (2013.01)

(58) Field of Classification Search
CPC ...... G03F 9/7015; G03F 9/7084; B29C 43/58
See application file for complete search history.

(56) References Cited

U.S. PATENT DOCUMENTS

| 5,640,243 A | * | 6/1997 | Koitabashi ................ G03F 9/70 |
| | | | 250/548 |
| 2002/0067473 A1 | * | 6/2002 | Deguchi ............. G03F 7/70216 |
| | | | 355/53 |

(Continued)

FOREIGN PATENT DOCUMENTS

JP 5451450 B2 3/2014

*Primary Examiner* — Jacob T Minskey
*Assistant Examiner* — Virak Nguon
(74) *Attorney, Agent, or Firm* — Rossi, Kimms & McDowell LLP (57) ABSTRACT

An imprint apparatus includes a mold holder for holding a mold, a substrate holder for holding a substrate, a dispenser for arranging imprint material on the substrate, and a scope for capturing an image of a mark. The substrate holder includes a reference plate having a reference mark whose image is captured by the scope, the dispenser is arranged in a first direction when viewed from the mold holder, and the reference plate is arranged between a virtual straight line which is parallel to a second direction perpendicular to the first direction when viewed from the mold holder and passes through a center of the substrate holder, and an edge of the substrate holder located in the first direction when viewed from the virtual straight line.

15 Claims, 10 Drawing Sheets

(56) References Cited

U.S. PATENT DOCUMENTS

| | | | |
|---|---|---|---|
| 2005/0053273 A1* | 3/2005 | Ostrom | G03F 9/7015 |
| | | | 382/151 |
| 2009/0246709 A1* | 10/2009 | Nakasugi | B82Y 10/00 |
| | | | 430/319 |
| 2010/0078840 A1* | 4/2010 | Kawakami | B82Y 10/00 |
| | | | 264/40.1 |
| 2011/0206852 A1 | 8/2011 | Shiode | |
| 2011/0316193 A1* | 12/2011 | Kawakami | B29C 43/003 |
| | | | 264/293 |
| 2015/0235880 A1* | 8/2015 | Inada | H01L 21/304 |
| | | | 438/16 |
| 2019/0196341 A1* | 6/2019 | Violette | G03F 7/70616 |

* cited by examiner

IMPRINT APPARATUS, IMPRINT METHOD, AND ARTICLE MANUFACTURING METHOD

BACKGROUND OF THE INVENTION

Field of the Invention

The present invention relates to an imprint apparatus, an imprint method, and an article manufacturing method.

Description of the Related Art

An imprint apparatus forms a pattern made of a cured product of an imprint material arranged on a substrate by bringing a mold into contact with the imprint material and curing the imprint material. The imprint apparatus includes a reference plate having a reference mark on a substrate holder that holds the substrate. In a calibration process, it is possible to obtain the relative positions of the mold and the substrate holder by, for example, measuring the relative positions of a mold mark and the reference mark with an alignment scope. Japanese Patent No. 5451450 describes an imprint apparatus having a stage reference mark provided on a wafer stage.

In an imprint process, the mold can be charged when the mold and the cured imprint material are separated from each other after the mold is brought into contact with the imprint material on the substrate to cure the imprint material. The reference plate can be formed by an insulator such as quartz as a base material, and the reference mark can be formed by an electrically conductive reflecting film such as a chromium film. Conventionally, in a series of sequences in which a pattern is formed with respect to each of a plurality of shot regions of the substrate, since the reference plate passes below the charged mold, discharge may occur between the mold and the reference plate, damaging the reference plate.

SUMMARY OF THE INVENTION

The present invention provides a technique advantageous in reducing damage to a reference plate.

One of aspects of the present invention provides an imprint apparatus that forms a pattern on a substrate by bringing a mold into contact with an imprint material arranged on the substrate and curing the imprint material, the apparatus comprising: a mold holder configured to hold the mold; a substrate holder configured to hold the substrate; a dispenser configured to arrange the imprint material on the substrate; and a scope configured to capture an image of a mark, wherein the substrate holder includes a reference plate which has a reference mark whose image is captured by the scope, the dispenser is arranged in a first direction when viewed from the mold holder, and the reference plate is arranged between a virtual straight line which is parallel to a second direction perpendicular to the first direction when viewed from the mold holder and passes through a center of the substrate holder, and an edge of the substrate holder located in the first direction when viewed from the virtual straight line.

Further features of the present invention will become apparent from the following description of exemplary embodiments with reference to the attached drawings.

DESCRIPTION OF THE EMBODIMENTS

The present invention will be described below with reference to the accompanying drawings by way of exemplary embodiments.

Figure 1:
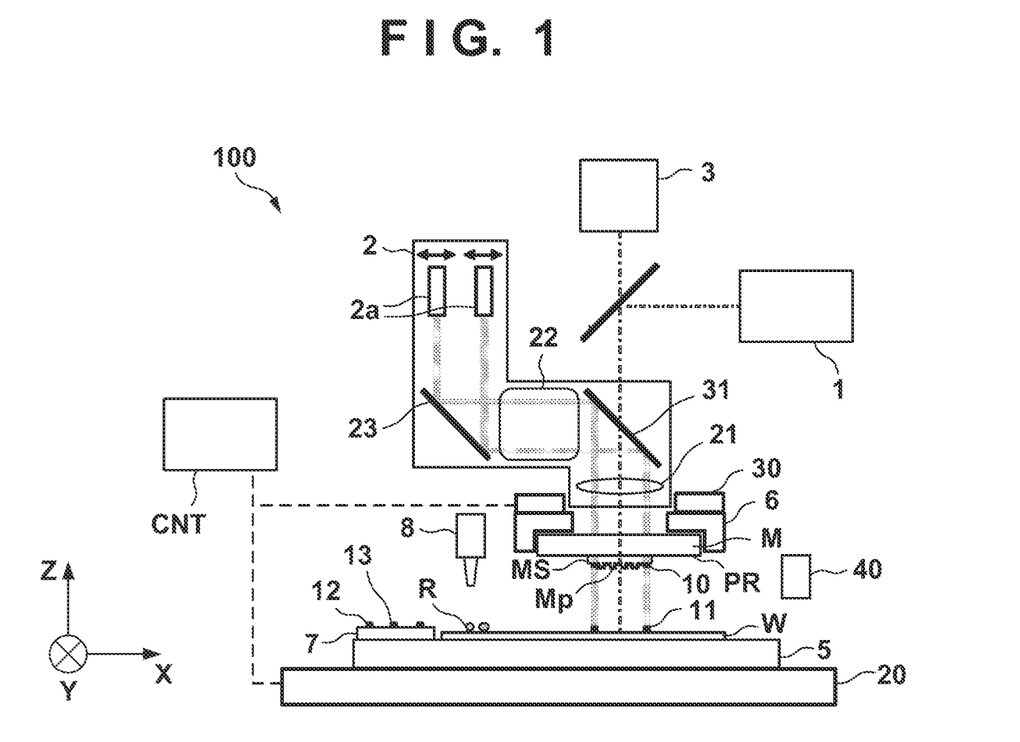
FIG. 1 is a view showing the arrangement of an imprint apparatus according to an embodiment of the present invention.

FIG. 1 shows the arrangement of an imprint apparatus 100 according to an embodiment of the present invention. The imprint apparatus 100 forms a pattern made of a cured product of an imprint material R arranged on a substrate W by bringing a mold M into contact with the imprint material R, and then curing the imprint material R.

A curable composition (may also be referred to as an uncured resin) which is cured by receiving curing energy is used as the imprint material. An electromagnetic wave, heat, or the like can be used as the curing energy. For example, light such as infrared light, visible rays, ultraviolet light, or the like whose wavelength is selected from a range of 10 nm (inclusive) to 1 mm (inclusive) can be used as the electromagnetic wave. The curable composition can be a composition that is cured by light irradiation or application of heat. Out of these, a photo-curable composition that is cured by light irradiation contains at least a polymerizable compound and a photopolymerization initiator, and may further contain a non-polymerizable compound or solvent as needed. The non-polymerizable compound is at least a material selected from the group consisting of a sensitizer, a hydrogen donor, an internal mold release agent, a surfactant, an antioxidant, a polymer component, and the like. The imprint material can be arranged on a substrate in a droplet-like shape, or an island-like shape or a film-like shape formed by a plurality of droplets connected to each other. The viscosity (viscosity at 25° C.) of the imprint material can be set at, for example, 1 mPa·s (inclusive) to 100 mPa·s (inclusive). For example, glass, ceramics, a metal, a semiconductor, a resin, or the like can be used as a material of the substrate. A member made of a material different from that for the substrate may be provided on the surface of the substrate, as needed.

For example, a silicon wafer, a compound semiconductor wafer, silica glass, or the like is used as the substrate W. The substrate W has a mark 11. The mold M can be formed by, for example, quartz or a resin. The mold M can include a pattern region Mp having a pattern to be transferred to the imprint material R on the substrate W. The pattern region Mp can be provided in, for example, a mesa portion MS. The mesa portion MS can be surrounded by a peripheral region PR. The mesa portion MS protrudes more than the peripheral region PR. The mold M has a mark 10. The mark 10 can be provided in, for example, the pattern region Mp.

In this specification and the accompanying drawings, directions are shown in an X-Y-Z coordinate system in which a direction parallel to the surface of the substrate W forms an X-Y plane. Let an X direction, a Y direction, and a Z direction be the directions parallel to an X-axis, a Y-axis, and a Z-axis, respectively, in the X-Y-Z coordinate system. Let $\theta X$, $\theta Y$, and $\theta Z$, respectively, be rotation about the X-axis, rotation about the Y-axis, and rotation about the Z-axis. Control or driving with regard to the X-axis, the Y-axis, and the Z-axis means control or driving with regard to the direction parallel to the X-axis, the direction parallel to the Y-axis, and the direction parallel to the Z-axis, respectively. Further, control or driving with regard to a $\theta X$-axis, a $\theta Y$-axis, and a $\theta Z$-axis means control or driving with regard to rotation about an axis parallel to the X-axis, rotation about an axis parallel to the Y-axis, and rotation about an axis parallel to the Z-axis, respectively. A position is information that can be specified based on X-axis, Y-axis, and Z-axis coordinates. An attitude is information that can be specified by values on the $\theta X$-axis, the $\theta Y$-axis, and the $\theta Z$-axis. Alignment means controlling the position and/or attitude. Alignment can include the control of the position and/or attitude of at least one of the substrate and the mold.

The imprint apparatus 100 can include a substrate holder 5 (substrate stage) that holds the substrate W, a substrate driving mechanism 20 that drives the substrate W by driving the substrate holder 5, a mold holder 6 that holds the mold M, and a mold driving mechanism 30 that drives the mold holder 6. The substrate driving mechanism 20 and the mold driving mechanism 30 form a relative driving mechanism that drives at least one of the substrate W and the mold M so as to adjust the relative positions of the substrate W and the mold M. Adjustment of the relative positions by the relative driving mechanism includes contact of the mold M with respect to the imprint material on the substrate W and driving in order to separate the mold M from a cured imprint material (pattern of a cured product). The substrate driving mechanism 20 can be configured to drive the substrate W with respect to a plurality of axes (for example, three axes of the X-axis, the Y-axis, and the $\theta Z$-axis, preferably six axes of the X-axis, the Y-axis, the Z-axis, the $\theta X$-axis, the $\theta Y$-axis, and the $\theta Z$-axis). The mold driving mechanism 30 can be configured to drive the mold M with respect to a plurality of axes (for example, three axes of the Z-axis, the $\theta X$-axis, and the $\theta Y$-axis, preferably six axes of the X-axis, the Y-axis, the Z-axis, the $\theta X$-axis, the $\theta Y$-axis, and the $\theta Z$-axis). The mold holder 6 can include a shape correction mechanism that deforms the mold M in accordance with the shape of a shot region of the substrate W.

A reference plate 7 having reference marks 12 and 13 is arranged on the substrate holder 5. The reference plate 7 can be used in calibration of the imprint apparatus 100. A base material of the reference plate 7 can be made of a material (for example, quartz) which is not likely to be deformed by heat and is stable. The reference marks 12 and 13 can be formed by a portion in which the base material is covered with an electrically conductive film (for example, a chromium film) that reflects light and a portion in which the base material is exposed. Alternatively, the reference marks 12 and 13 can be formed by a portion in which the base material is covered with an insulating member that reflects light and the portion in which the base material is exposed.

The imprint apparatus 100 can further include a curing device 1, an alignment optical system 2, an observation optical system 3, a dispenser 8, and a controller CNT. The curing device 1 can cure the imprint material R on the substrate W by irradiating the imprint material R with curing energy (in this example, light energy such as an ultraviolet beam) that cures the imprint material R. The mold M can be made of a material that transmits the curing energy. When the curing device 1 generates the light energy as the curing energy, it is possible to adopt, for example, a high-pressure mercury lamp, various excimer lamps, an excimer laser, a light-emitting diode, or a laser diode as a light source.

The alignment optical system 2 is used to measure the relative positions of the mold M and the shot region of the substrate W. Based on the relative positions of the mold M and the shot region of the substrate W, at least one of the substrate driving mechanism 20 and the mold driving mechanism 30 is driven to align the mold M and the shot region of the substrate W. At this time, the shape correction mechanism provided in the mold holder 6 can also be driven.

The alignment optical system 2 includes at least one scope 2a, preferably a plurality of scopes 2a that capture images of the mark 11 of the substrate W, the mark 10 of the mold M, and the reference marks 12 and 13 of the reference plate 7. The relative positions of the mold M and the shot region of the substrate W are obtained by processing the images obtained by image capturing. Each scope 2a can be driven in an X-axis direction and a Y-axis direction in accordance with the position of the mark 10 of the mold M or the mark 11 of the substrate W Furthermore, each scope 2a may be configured to be drivable in a Z-axis direction in order to adjust the focus or may incorporate a focus adjustment mechanism. The alignment optical system 2 can further include a plurality of optical elements 21, 22, 23, and 31. In this example, the plurality of optical elements 21, 22, 23, and 31 form a relay optical system, and form the images of the marks 10 and 11 on a plane conjugate to the surface of the substrate W.

Figure 2:
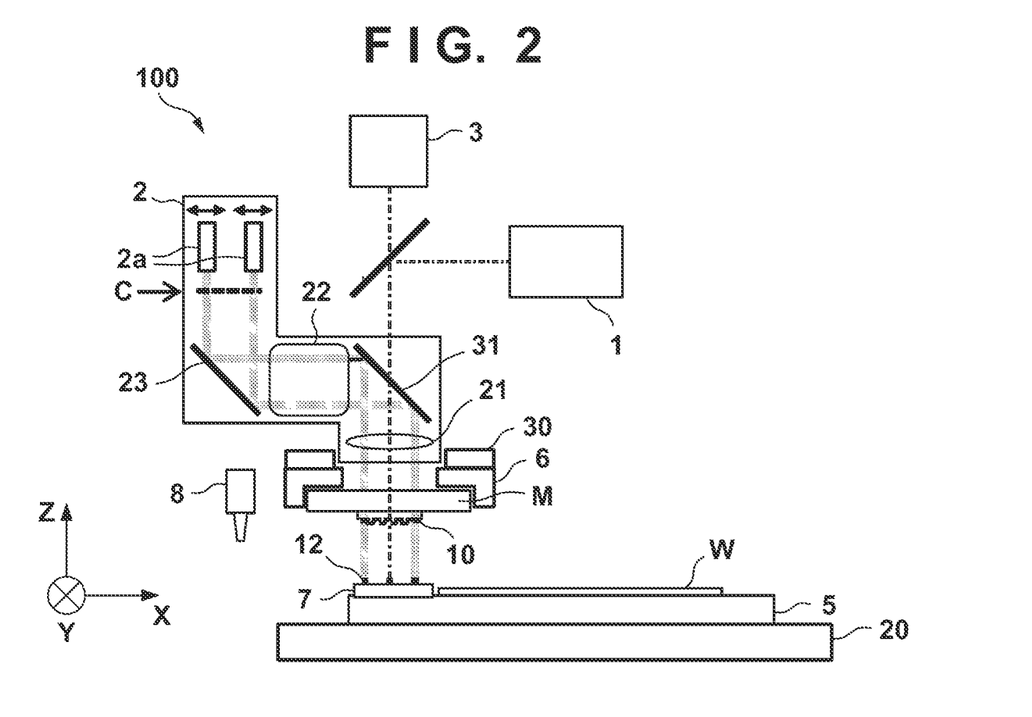
FIG. 2 is a view for explaining calibration performed by using a reference mark.

When the mold M is exchanged, as schematically shown in FIG. 2, the relative positions of the mark 10 of the mold M and the alignment mark 12 out of a plurality of marks of the reference plate 7 are measured by using the alignment optical system 2. Hereinafter, it is possible to control the relative positions of the mold M and the substrate holder 5 based on the relative positions obtained by the measurement.

It is also possible to measure the relative positions of the mark 10 of the mold M and the mark 11 of the substrate W by using the alignment optical system 2. The respective scopes 2a of the alignment optical system 2 are configured to enable a visual field to cover the mark 10 of the mold M and the mark 11 of the substrate W simultaneously as long as an arrangement error of the mold M, an arrangement error of the substrate W, an arrangement error of the mark 11 of the substrate W, and the like fall within an allowable range. It is therefore possible, based on the relative positions of the mark 10 of the mold M and the mark 12 of the reference plate 7, to cause the visual field of each scope 2a in the alignment optical system 2 to cover the mark 11 provided in the shot region of the substrate W held by the substrate holder 5.

The observation optical system 3 is an optical system for observing all the respective shot regions of the substrate W. The observation optical system 3 also serves as a scope that captures an image of a mark. The observation optical system 3 can be used to observe the state of the imprint process. The state of the imprint process can be, for example, a contact state between the mold M and the imprint material R on the substrate W, the filling state of a concave portion that forms the pattern of the mold M with the imprint material R, a separation state of the mold M from the cured imprint material R on the substrate W, or the like.

Figure 3:
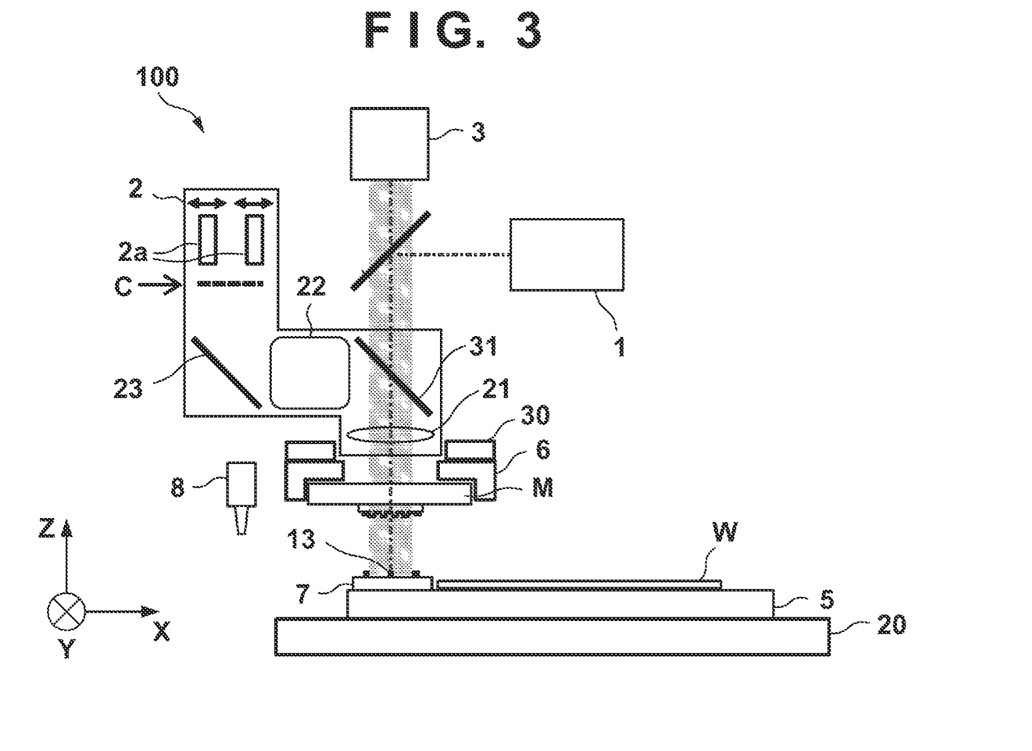
FIG. 3 is a view for explaining calibration performed by using the reference mark.

It is desirable that the optical axis of the observation optical system 3 and the optical axis of the alignment optical system 2 are the same. However, errors may exist to some extent between them. To cope with this, calibration of the observation optical system 3 can be performed. Calibration of the observation optical system 3 can be performed by using the reference plate 7. When performing adjustment (for example, light amount adjustment or visual field adjustment) of an observation function, as schematically shown in FIG. 3, the substrate driving mechanism 20 can drive the substrate holder 5 such that the reference mark 13 for the observation optical system 3 out of the plurality of marks of the reference plate 7 falls within the visual field of the observation optical system 3. In FIG. 3, the observation optical system 3 is adjusted in a state in which the mold holder 6 holds the mold M. However, the observation optical system 3 may be adjusted in a state in which the mold M is detached from the mold holder 6.

The dispenser 8 arranges the imprint material R on the shot region of the substrate W. In an example, the dispenser 8 includes a nozzle that discharges the imprint material R and arranges the imprint material R in the shot region of the substrate W by discharging the imprint material R from the nozzle while performing scanning driving of the substrate W by the substrate driving mechanism 20. The controller CNT controls the substrate driving mechanism 20, the mold driving mechanism 30, the curing device 1, the alignment optical system 2, the observation optical system 3, and the dispenser 8. The controller CNT can be formed by, for example, a PLD (short for Programmable Logic Device) such as an FPGA (short for Field Programmable Gate Array), an ASIC (short for Application Specific Integrated Circuit), a general-purpose computer with a program installed, or a combination of all or some of them.

The imprint apparatus 100 can further include a charge removing device 40 that reduces a charge amount of the mold M. The charge removing device 40 can include, for example, an ionizer. When a member other than the mold M, for example the reference plate 7, is charged, the charge removing device 40 can operate so as to reduce the charge amount.

Figure 4A:
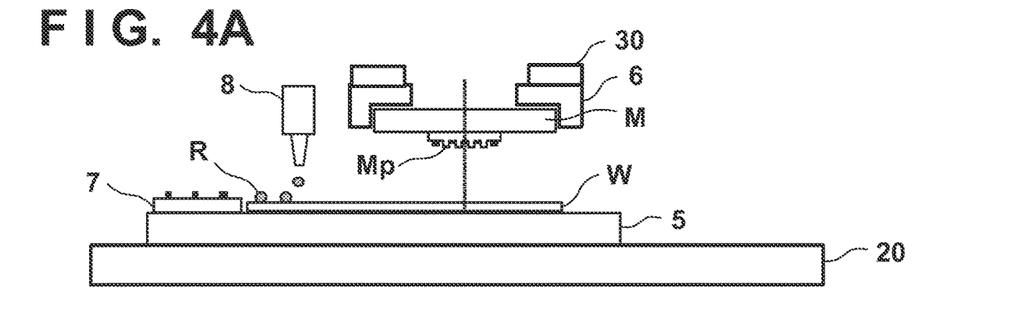
FIGS. 4A to 4D are views for explaining an imprint process (pattern formation process) for one shot region by the imprint apparatus.

An imprint process (pattern formation process) for one shot region by the imprint apparatus 100 will be described below with reference to FIGS. 4A to 4D. First, as shown in FIG. 4A, the dispenser 8 arranges the imprint material R on the shot region of the substrate W while the substrate driving mechanism 20 drives the substrate holder 5 (substrate W) such that the shot region of the substrate W passes below the dispenser 8.

Figure 4B:
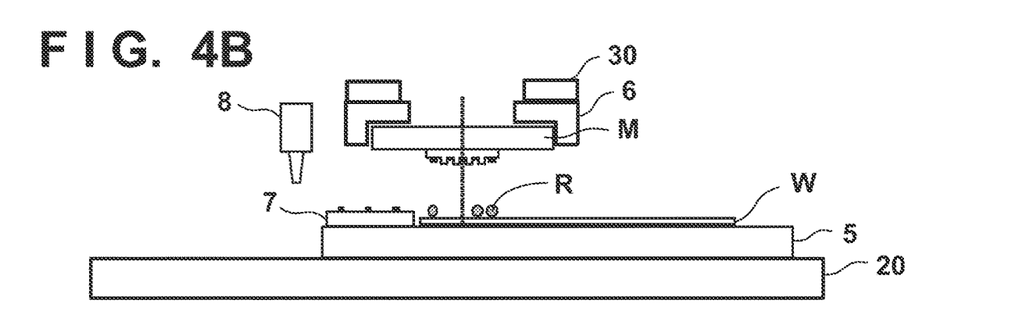
Figure 4C:
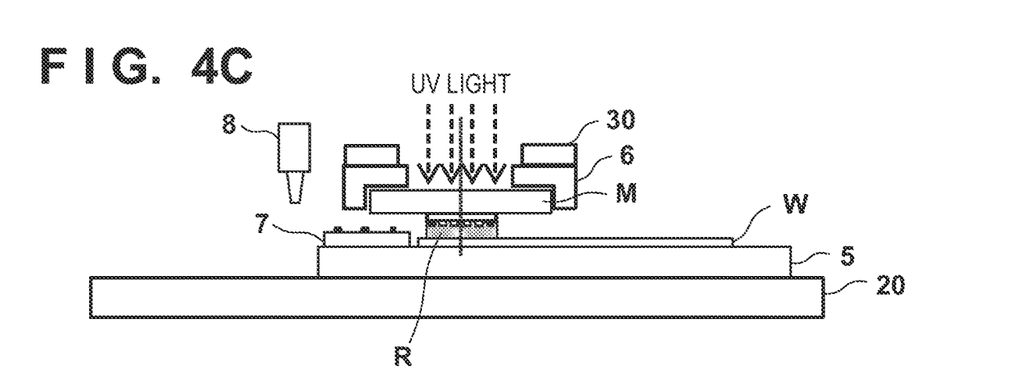

Next, as shown in FIG. 4B, the substrate driving mechanism 20 drives the substrate holder 5 (substrate W) such that the shot region where the imprint material R is arranged is arranged below the pattern region Mp of the mold M. Next, as shown in FIG. 4C, while the relative positions of the shot region of the substrate W and the pattern region Mp of the mold M are measured by using the alignment optical system 2, the substrate driving mechanism 20 and the mold driving mechanism 30 align the shot region and the pattern region Mp. Moreover, at least one of the substrate driving mechanism 20 and the mold driving mechanism 30 is controlled such that the imprint material R on the substrate W and the pattern region Mp of the mold contact each other. Then, the curing device 1 irradiates the imprint material R with the curing energy, curing the imprint material R and forming a pattern Dp made of the cured imprint material R on the substrate W.

Figure 4D:
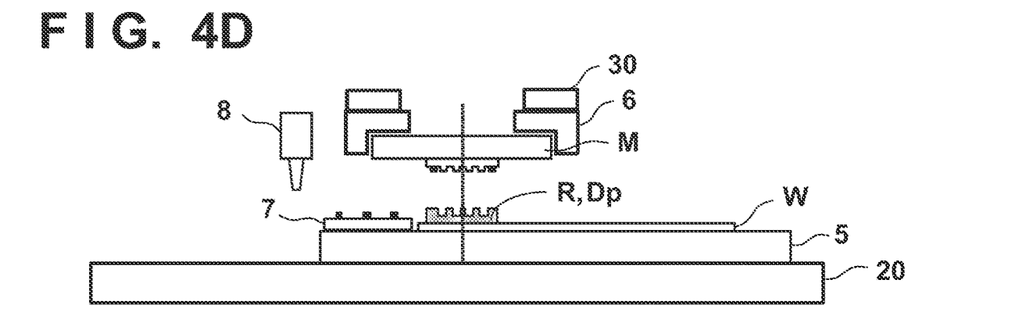

Next, as shown in FIG. 4D, at least one of the substrate driving mechanism 20 and the mold driving mechanism 30 is controlled such that the mold M and the pattern Dp made of the cured imprint material R on the substrate W are separated from each other. The above-described imprint process is performed on each of a plurality of shot regions of the substrate W.

Figure 5A:
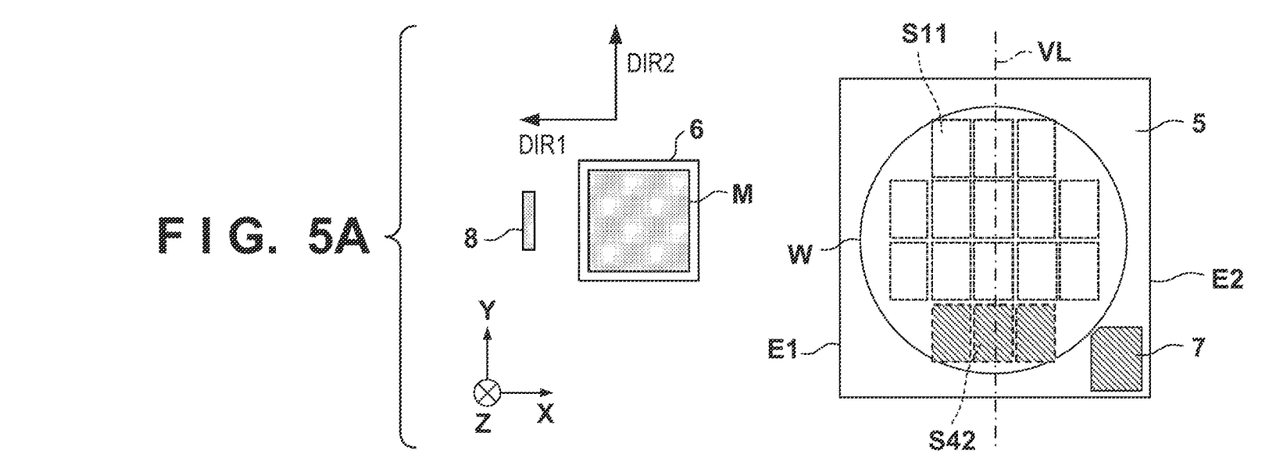
FIGS. 5A to 5D are views for explaining a change in relative positions of a dispenser, a mold, and a reference plate in an imprint apparatus according to a comparative example.

A change in relative positions of a dispenser 8, a mold M, and a reference plate 7 in an imprint apparatus according to a comparative example will be described here with reference to FIGS. 5A to 5D. The positions of the dispenser 8 and the mold M are fixed, and a substrate holder 5 moves. In the comparative example, as shown in FIG. 5A, the dispenser 8 is arranged in a first direction (−X direction) DIR1 when viewed from a mold holder 6 or the mold M. In the comparative example, the reference plate 7 is arranged between a virtual straight line VL which is parallel to a second direction DIR2 perpendicular to the first direction DIR1 and passes through the center of the substrate holder 5 or a substrate W, and an edge E2 of the substrate holder in a direction opposite to the first direction DIR1 when viewed from the virtual straight line VL.

Figure 5B:
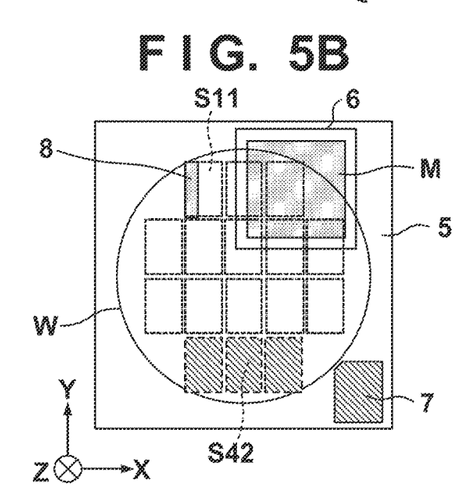
Figure 5C:
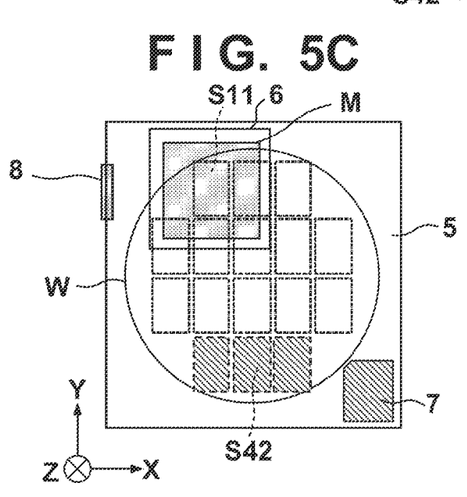

In the imprint process for a shot region S11, as shown in FIG. 5B, the shot region S11 is positioned under the dispenser 8 in order to arrange an imprint material R in the shot region S11. In this state, because the mold M and the reference plate 7 are spaced apart from each other sufficiently, discharge between the charged mold M and a reference mark of the reference plate 7 does not occur, and damage to the reference plate 7 does not occur. Next, as shown in FIG. 5C, a substrate driving mechanism 20 drives the substrate holder 5 such that the shot region S11 where the imprint material R is arranged is positioned under the mold M. In this state as well, because the mold M and the reference plate 7 are spaced apart from each other sufficiently, discharge between the charged mold M and a reference mark of the reference plate 7 does not occur, and damage to the reference plate 7 does not occur.

Figure 5D:
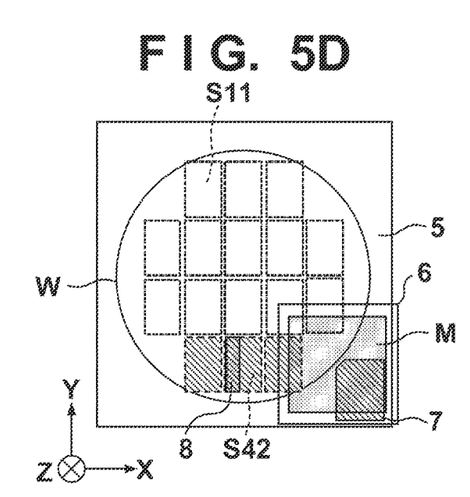

In the imprint process for a shot region S42, as shown in FIG. 5D, the shot region S42 is positioned under the dispenser 8 in order to arrange the imprint material R on the shot region S42. In the state of FIG. 5D, the reference plate 7 is located under the mold M, and thus discharge may occur between the charged mold M and the reference mark of the reference plate 7, damaging the mold M.

Figure 6A:
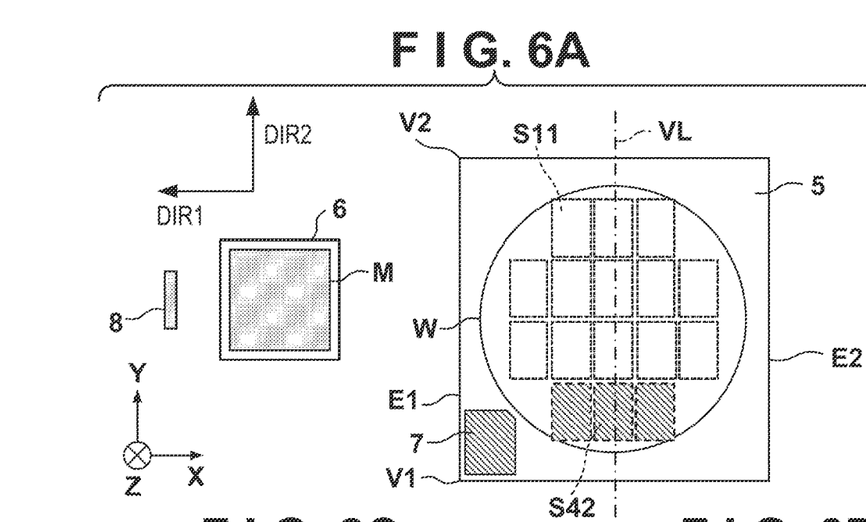
FIGS. 6A to 6E are views for explaining a change in relative positions of a dispenser, a mold, and a reference plate in the imprint apparatus according to the first embodiment.

A change in relative positions of the dispenser 8, the mold M, and the reference plate 7 in the imprint apparatus 100 according to the first embodiment of the present invention will be described below with reference to FIGS. 6A to 6E. The positions of the dispenser 8 and the mold M are fixed, and a substrate holder 5 moves. In the first embodiment, as shown in FIG. 6A, the dispenser 8 is arranged in a first direction (−X direction) DIR1 when viewed from the mold holder 6 or the mold M. In the first embodiment, the reference plate 7 is arranged between a virtual straight line VL which is parallel to a second direction DIR2 perpendicular to the first direction DIR1 and passes through the center of the substrate holder 5 or the substrate W, and an edge E1 of the substrate holder in the first direction DIR1 when viewed from the virtual straight line VL. Such an arrangement is advantageous in reducing discharge between the charged mold M and the reference plate 7, and reducing damage to the reference plate 7, as will be described below.

Note that the substrate holder 5 can have a rectangular shape which has two sides parallel to the first direction DIR1 and two sides parallel to the second direction DIR2. The reference plate 7 can be arranged between the center of the substrate holder 5 and an apex V1 of the rectangular shape located in the first direction DIR1 when viewed from the virtual straight line VL. The center of the substrate holder 5 can be, for example, the barycenter of the substrate holder 5. Such an arrangement is advantageous in downsizing the substrate holder 5. In FIG. 6A, the reference plate 7 is arranged between the center of the substrate holder 5 and the apex V1 of the rectangular shape located in the first direction DIR1 when viewed from the virtual straight line VL. However, the reference plate 7 may be arranged between the center of the substrate holder 5 and another apex V2 of the rectangular shape located in the first direction DIR1 when viewed from the virtual straight line VL.

Figure 6B:
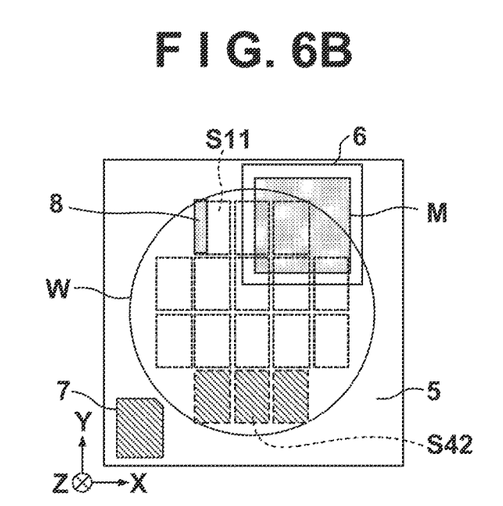
Figure 6C:
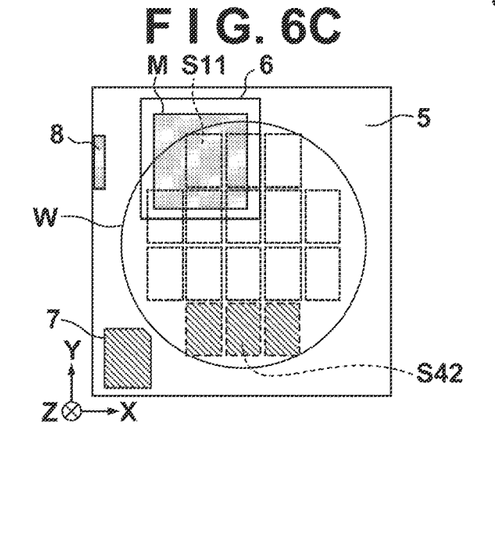

In the imprint process for a shot region S11, as shown in FIG. 6B, the shot region S11 is positioned under the dispenser 8 in order to arrange the imprint material R in the shot region S11. In this state, because the mold M and the reference plate 7 are spaced apart from each other sufficiently, discharge between the charged mold M and the reference mark of the reference plate 7 does not occur, and damage to the reference plate 7 does not occur. Next, as shown in FIG. 6C, the shot region S11 where the imprint material R is arranged is positioned under the mold M. In this state as well, because the mold M and the reference plate 7 are spaced apart from each other sufficiently, discharge between the charged mold M and a reference mark of the reference plate 7 does not occur, and damage to the reference plate 7 does not occur.

Figure 6D:
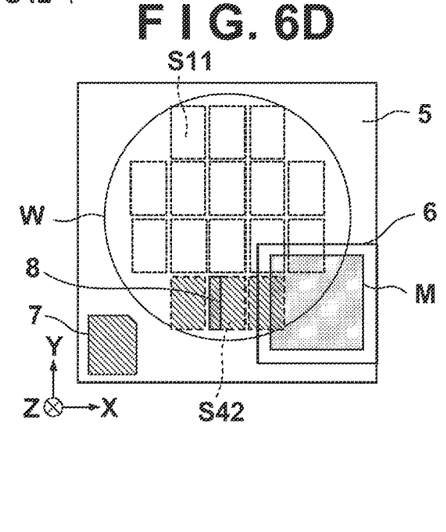
Figure 6E:
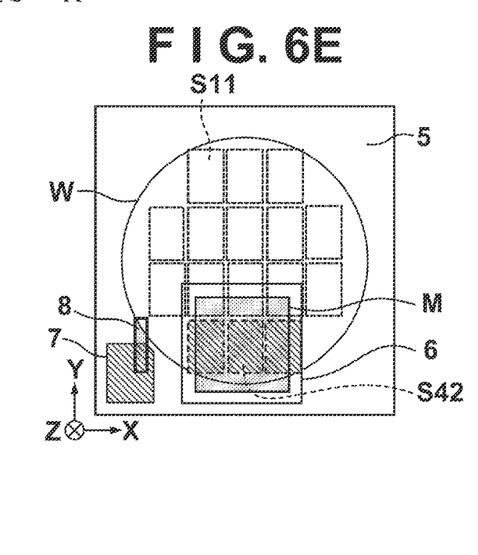

In the imprint process for a shot region S42, as shown in FIG. 6D, the shot region S42 is positioned under the dispenser 8 in order to arrange the imprint material R in the shot region S42. In this state, because the mold M and the reference plate 7 are spaced apart from each other sufficiently, discharge between the charged mold M and the reference mark of the reference plate 7 does not occur, and damage to the reference plate 7 does not. Next, as shown in FIG. 6E, the shot region S42 where the imprint material R is arranged is positioned under the mold M. In this state as well, because the mold M and the reference plate 7 are spaced apart from each other sufficiently, discharge between the charged mold M and a reference mark of the reference plate 7 does not occur, and damage to the reference plate 7 does not occur.

In the first embodiment, also in the imprint process for other shot regions, because the mold M and the reference plate 7 are spaced apart from each other sufficiently, discharge between the charged mold M and a reference mark of the reference plate 7 does not occur, and damage to the reference plate 7 does not occur.

Figure 7A:
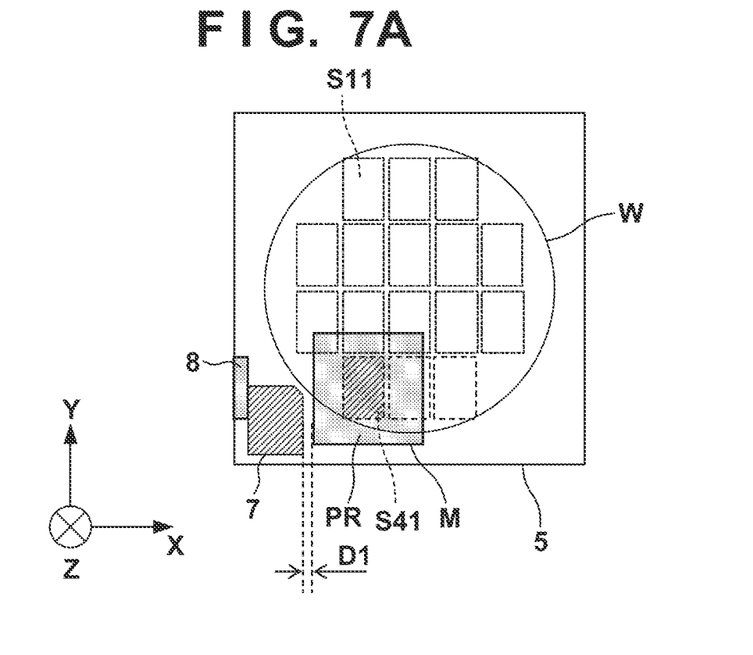
FIGS. 7A and 7B are views each showing the arrangement of the reference plate.
Figure 7B:
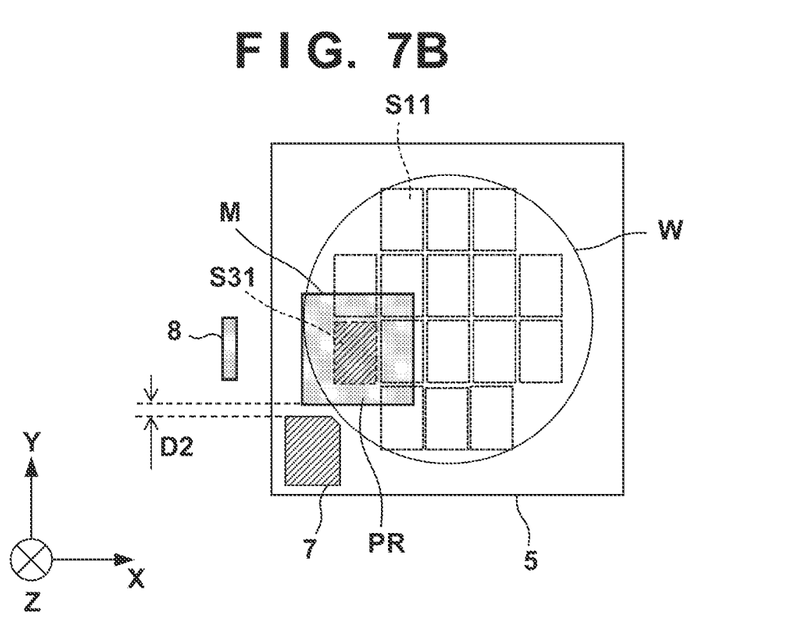

Note that as schematically shown in FIGS. 7A and 7B, it is preferable that the reference plate 7 does not face the mold M in even a case in which the pattern region Mp of the mold M is positioned with respect to any of the plurality of shot regions of the substrate W. Alternatively, it is preferable that the reference plate 7 does not face the peripheral region PR of the mold M in even a case in which the pattern region Mp of the mold M is positioned with respect to any of the plurality of shot regions of the substrate W.

In FIGS. 7A and 7B, two shot regions closest to the reference plate 7 are shot regions S41 and S31. FIG. 7A shows a state in which the pattern region Mp of the mold M is positioned with respect to the shot region S41. Letting D1 be a distance between the reference plate 7 and a side closest to the reference plate 7 out of four sides of the mold M, D1>0 holds. FIG. 7B shows a state in which the pattern region Mp of the mold M is positioned with respect to the shot region S31. Letting D2 be a distance between the reference plate 7 and a side closest to the reference plate 7 out of four sides of the mold M, D2>0 holds.

The controller CNT controls driving of the substrate holder 5 by the substrate driving mechanism 20 so the reference plate 7 does not face the mold M between pattern formation for the first shot region and pattern formation for a final shot region. The first shot region is a shot region where a pattern is formed first out of the plurality of shot regions of the substrate W. The final shot region is a shot region where a pattern is formed finally out of the plurality of shot regions of the substrate W.

Pattern formation for the first shot region includes at least the arrangement of the imprint material R for the first shot region, contact between the imprint material R and the mold M in the first shot region, and curing of the imprint material R in the first shot region. Note that continuously from a process of arranging the imprint material R for the first shot region, the mold M and the imprint material R may contact each other in the first shot region after the imprint material is also arranged for all or some of other shot regions out of the plurality of shot regions.

In calibration described with reference to FIGS. 2 and 3, the alignment optical system 2 or the observation optical system 3 captures (observes) the images of the marks of the reference plate 7 via the mold M. Therefore, the reference plate 7 is arranged so as to face the mold M. Such calibration can be performed after the charge removing device 40 reduces the charge amount of the mold M.

On the other hand, in the imprint process for the plurality of shot regions of the substrate W, it is impossible to obtain the effect of charge removal by the charge removing device 40 sufficiently if a gap between the substrate W and the charged mold M is maintained. Thus, widening the gap between the mold M and the substrate W halfway through the imprint process for the plurality of shot regions of the substrate W can be one method of enhancing the charge removal effect. In this method, however, productivity may be decreased.

An imprint method performed by using the above-described imprint apparatus 100 includes a step of performing a process of arranging the imprint material R for each of the plurality of shot regions of the substrate W by the dispenser 8, bringing the mold M into contact with the imprint material R, and curing the imprint material R. From the start of the process to end of the process, the substrate holder 5 can be driven so the reference plate 7 does not face the mold M.

According to the first embodiment, it is possible to reduce the possibility of damage to the reference plate 7 while reducing the necessity of charge removal.

The second embodiment of the present invention will be described below with reference to FIGS. 8 to 11. The second embodiment can be performed together with the first embodiment or independently of the first embodiment. Matters not particularly mentioned in the second embodiment can comply with the first embodiment.

First, a reference plate 7 according to a comparative example will be described with reference to FIGS. 8 and 9. However, the reference plate 7 according to the comparative example to be described with reference to FIGS. 8 and 9 can be applied to the first embodiment. The reference plate 7 can have a plurality of reference marks that include reference marks 12 and 13. A base material of the reference plate 7 can be made of a material (for example, quartz) which is not likely to be deformed by heat and is stable. The reference marks 12 and 13 can be formed by a portion (hatched portion) in which the base material is covered with a plurality of electrically conductive reflectors CR each being made of an electrically conductive film (for example, a chromium film) that reflects light and a portion (blank portion) in which the base material is exposed. The plurality of electrically conductive reflectors CR can be formed by, for example, an electrically conductive material layer of a single-layer or multilayer. Note that all or some of the plurality of electrically conductive reflectors CR can be portions electrically connected to each other.

Figure 8:
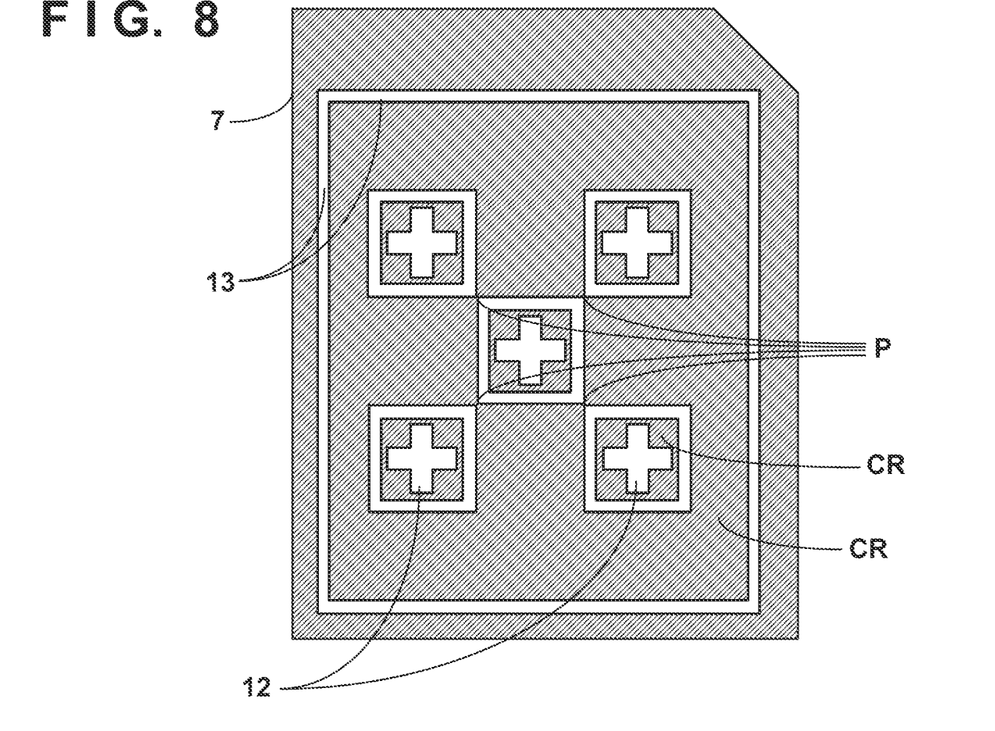
FIG. 8 is a view showing the arrangement of a reference plate.
Figure 9:
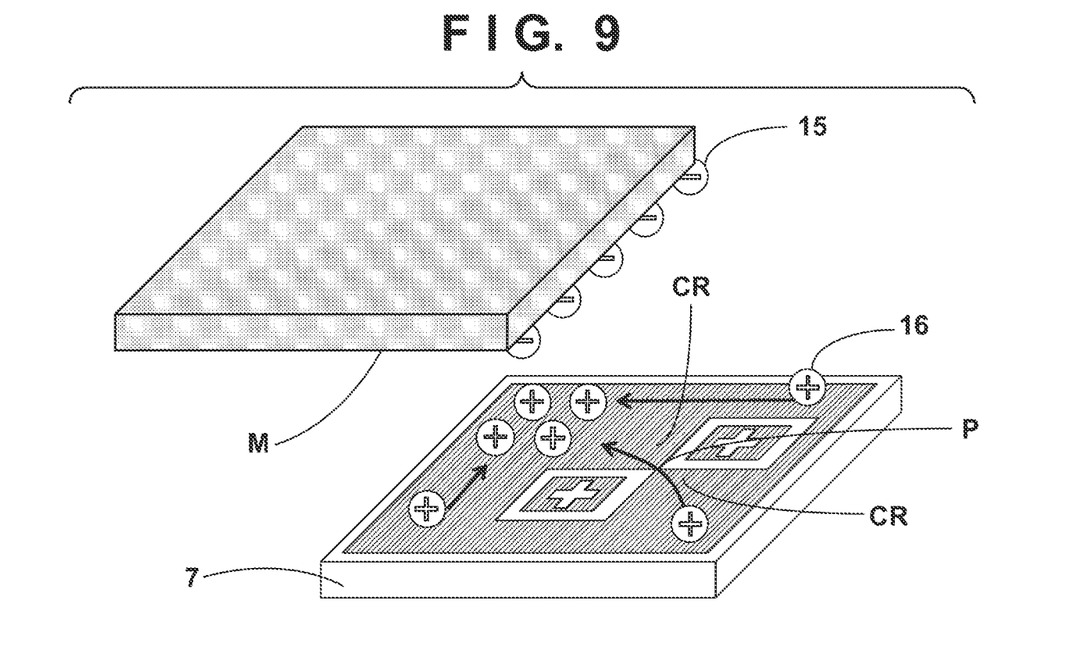
FIG. 9 is a view schematically showing movement of charges on the reference plate.

Consider a case in which the present invention has a structure in which two or more adjacent electrically conductive reflectors CR point-contact each other at points P as shown in FIG. 8. In this case, as shown in FIG. 9, in a state in which a charged mold M faces the reference plate 7, electrostatic induction can occur by a charge 15 of the mold M, and charge on the electrically conductive reflectors CR of the reference plate 7 can move. In FIG. 9, the charges 15 charging the mold M are negative charges, and charges 16 on the electrically conductive reflectors CR of the reference plate 7 are positive charges. Depending on conditions, however, they may be reversed. If there is the point P on a path of the charges 16 moving on the electrically conductive reflectors CR by electrostatic induction, the charges may be concentrated on the point P, damaging the reference marks.

Figure 10:
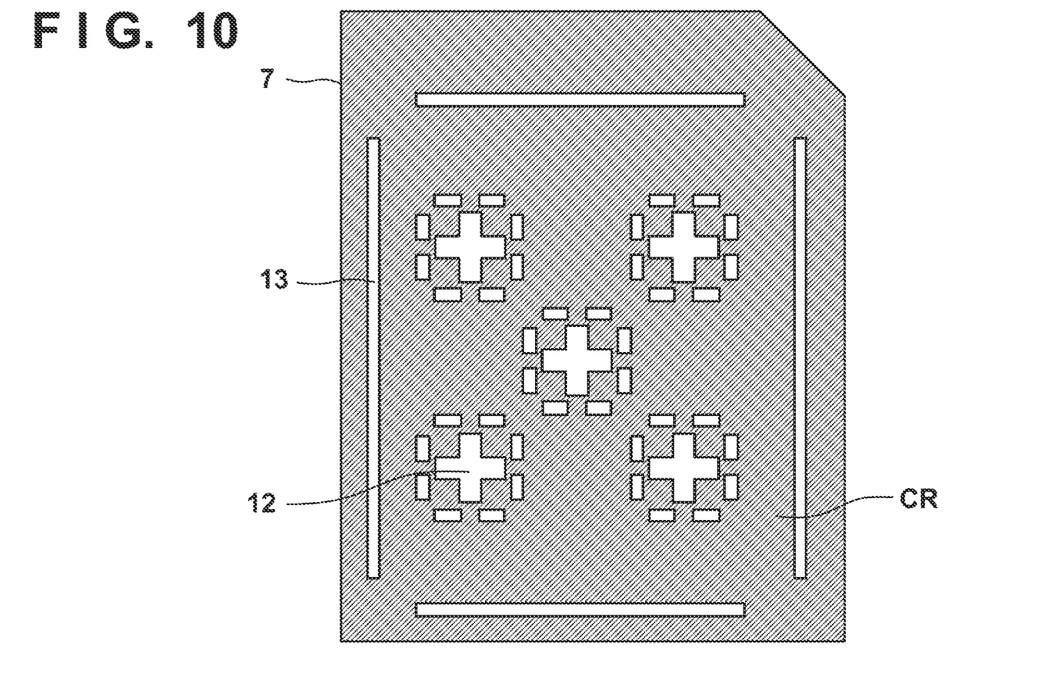
FIG. 10 is a view showing one example of the arrangement of a reference plate according to the second embodiment.
Figure 11:
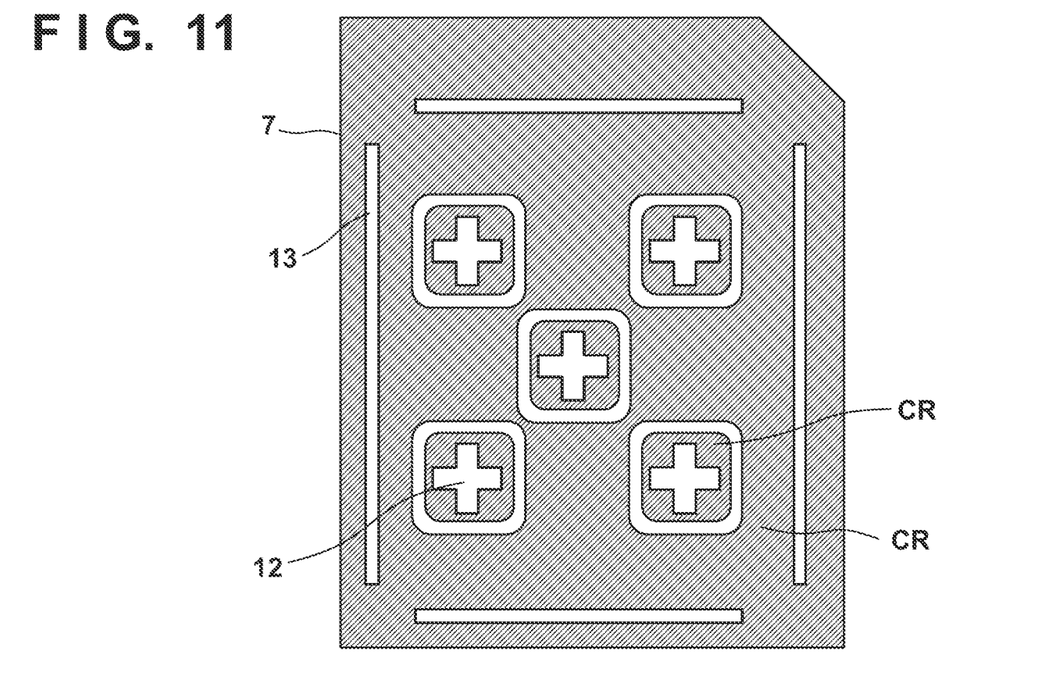
FIG. 11 is a view showing another example of the arrangement of the reference plate according to the second embodiment.

FIG. 10 shows one example of a reference plate 7 according to the second embodiment. FIG. 11 shows another example of the reference plate 7 according to the second embodiment. In the second embodiment, reference marks 12 and 13 include a plurality of electrically conductive reflectors CR, and the plurality of electrically conductive reflectors CR are arranged so as not to point-contact each other. In the example of FIG. 11, some of the plurality of electrically conductive reflectors CR adopt a round shape. All the plurality of electrically conductive reflectors CR may adopt the round shape.

Consider a mode in which minute lines undergo a discharge breakdown. The discharge breakdown can occur when the in-plane distribution of charges Q accumulated on the electrically conductive reflectors CR changes by facing a charged mold M. When the in-plane distribution of the charges Q changes, the charges Q moving through the minute lines generate a large amount of Joule heat near the minute line having the highest resistance. If accumulation of the Joule heat exceeds the melting point of each electrically conductive reflector CR, the minute lines melt, and reference marks are damaged. Letting Temp be a temperature rise by the Joule heat in a minute line portion, the temperature rise Temp can be given by:

$$\text{Temp} = A \cdot \rho_e \cdot Q^2 / (d^2 \cdot W^2 \cdot \rho \cdot c \cdot t)$$

wherein $\rho_e$ represents the volume resistivity of each electrically conductive reflector CR, Q represents the charges flowing through the electrically conductive reflector CR, d represents the thickness of the electrically conductive reflector CR, W represents the line width of a path through which the charges Q flow, $\rho$ represents the density of the electrically conductive reflector CR, c represents the specific heat of the electrically conductive reflector CR, t represents a time in which the charges Q flow, and A represents the constant of unit conversion.

In the arrangement of each of FIGS. 5A to 5D, as a result of examining the amount of moving charges, it is found that charges of 1 to 50 pC move within several ms. In a chromium film having a thickness of 100 nm, if charges of 50 pC flow through a line having a width of 180 nm in 1 ms, a temperature rise exceeding 1,907° C. as the melting point of chromium occurs. The temperature rise is inversely proportional to the square of a line width w, and thus the line width is preferably at least 57 nm or more. Note that the line width is preferably 214 nm or more having fourfold likelihood and is more preferably 570 nm or more having tenfold likelihood.

Figure 12:
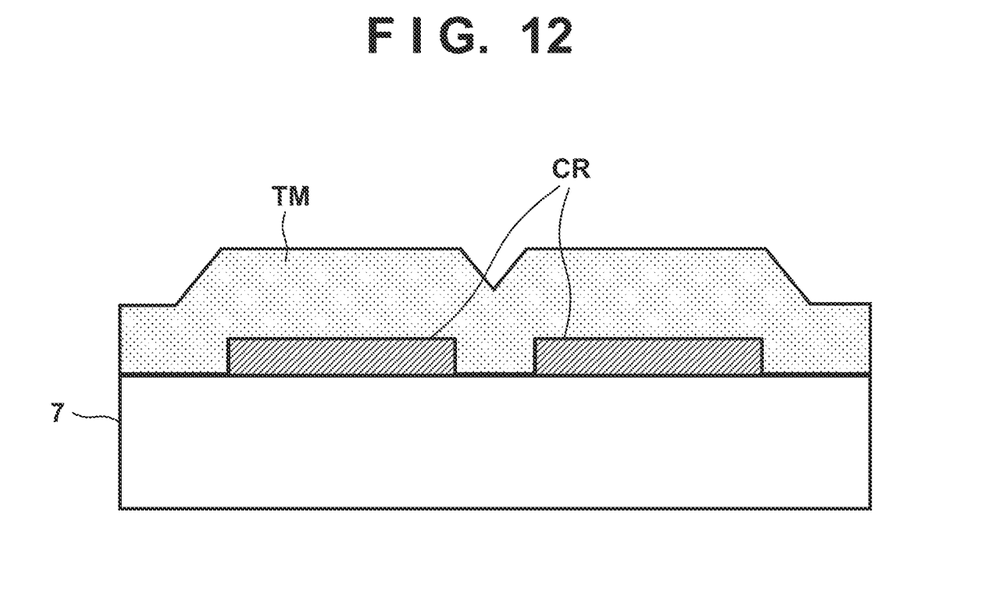
FIG. 12 is a view showing the arrangement of a reference plate according to the third embodiment.

The third embodiment of the present invention will be described below with reference to FIG. 12. The third embodiment can be performed together with the first and/or second embodiment or independently of the first and second embodiments. Matters not particularly mentioned in the third embodiment can comply with the first and/or second embodiment.

A reference plate 7 of the third embodiment includes one or a plurality of electrically conductive reflectors CR and a transparent electrically conductive film TM that covers the one or the plurality of electrically conductive reflectors CR. The transparent electrically conductive film TM can be formed by, for example, an ITO film, an IZO film, a TNO film, an Al thin film, or the like. The transparent electrically conductive film TM can be made of various other materials in a range where the observation of reference marks 12 and 13 of the reference plate 7 is not impeded. The transparent electrically conductive film TM can electrically be connected to a member having a predetermined potential such as ground in an imprint apparatus but may be floating. Even if a charge distribution is formed instantaneously by providing the transparent electrically conductive film TM, charges flow through the surface of the transparent electrically conductive film TM, but do not flow through the electrically conductive reflectors CR that form the reference marks 12 and 13.

In an example, the electrically conductive reflectors CR of the reference plate 7 have an arrangement shown in FIG. 8 and are formed by a chromium layer of a single layer having a thickness of 100 nm, and the transparent electrically conductive film TM is formed by the ITO film having a thickness of 200 nm. Although a step is formed by the chromium film, it is possible to make a resistance value of the transparent electrically conductive film TM sufficiently small by setting the thickness of the transparent electrically conductive film TM to 200 nm. The light transmittance of the ITO film is 70% or higher when the reference marks are observed with light having a wavelength of 450 nm. In this example, it is confirmed that an alignment optical system 2 and an observation optical system 3 can observe the reference marks without any damage to the reference marks. Note that the electrically conductive reflectors CR of the reference plate 7 may have an arrangement shown in FIG. 10 or 11.

A pattern of a cured product formed by using an imprint apparatus 100 is used permanently for at least some of various articles or used temporarily when the various articles are manufactured. The article includes an electric circuit element, an optical element, a MEMS, a recording element, a sensor, a mold, or the like. The electric circuit element includes, for example, a volatile or nonvolatile semiconductor memory such as a DRAM, an SRAM, a flash memory, or an MRAM or a semiconductor element such as an LSI, a CCD, an image sensor, or an FPGA. The mold includes an imprint mold or the like.

The pattern of the cured product is used without any change as a constituent member of at least a part of the above-described article or used temporarily as a resist mask. The resist mask is removed after etching, ion implantation, or the like is performed in a processing step of the substrate.

Figure 13A:
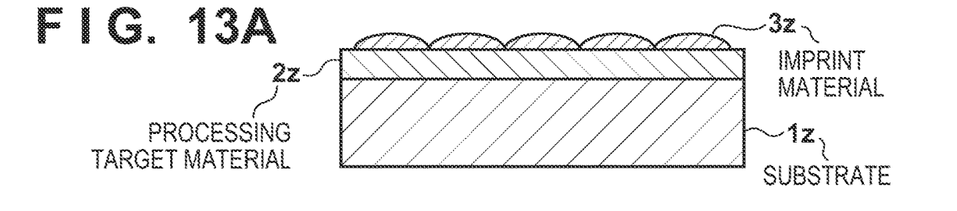
FIGS. 13A to 13F are views showing an article manufacturing method.

An article manufacturing method of forming a pattern on a substrate by an imprint apparatus 100, processing the substrate on which the pattern has been formed, and manufacturing an article from the substrate on which the process has been performed will be described next. As shown in FIG. 13A, a substrate $1z$ such as a silicon wafer having a processing target material $2z$ such as an insulator formed on its surface is prepared, and then an imprint material $3z$ is applied on the surface of the processing target material $2z$ by an inkjet method or the like. A state is shown here in which the imprint material $3z$ formed into a plurality of droplets is applied on the substrate.

Figure 13B:
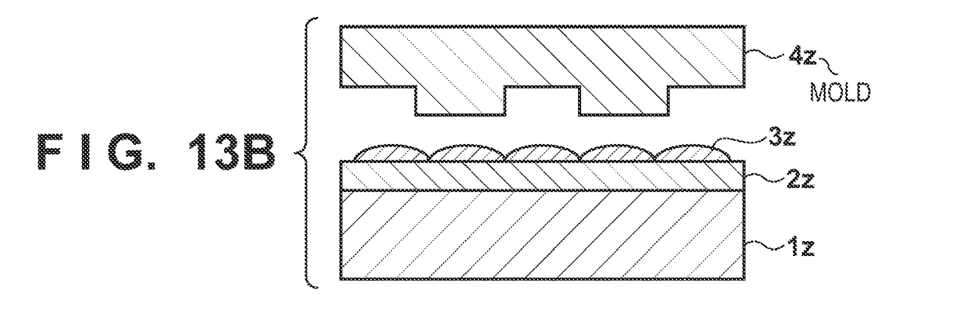
Figure 13C:
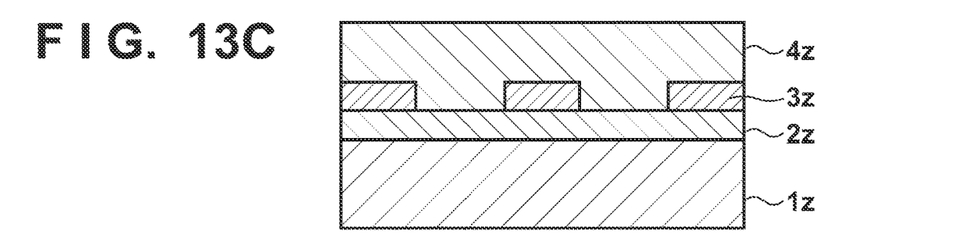

As shown in FIG. 13B, a side of an imprinting mold $4z$ on which its three-dimensional pattern is formed is caused to face the imprint material $3z$ on the substrate. As shown in FIG. 13C, a mold $4z$ and the substrate $1z$ to which the imprint material $3z$ is applied are brought into contact with each other, and a pressure is applied. The imprint material $3z$ fills the gap between the mold $4z$ and the processing target material $2z$. The imprint material $3z$ is cured by irradiating it with light as curing energy through the mold $4z$ in this state.

Figure 13D:
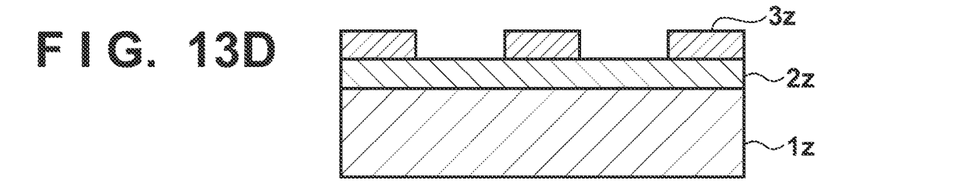

As shown in FIG. 13D, the pattern of the cured product of the imprint material $3z$ is formed on the substrate $1z$ by releasing the mold $4z$ and the substrate $1z$ from each other after curing the imprint material $3z$. The pattern of this cured product has a shape such that the concave portion of the mold corresponds to the convex portion of the cured product, and the convex portion of the mold corresponds to the concave portion of the cured product. That is, the three-dimensional pattern of the mold $4z$ is transferred to the imprint material $3z$.

Figure 13E:
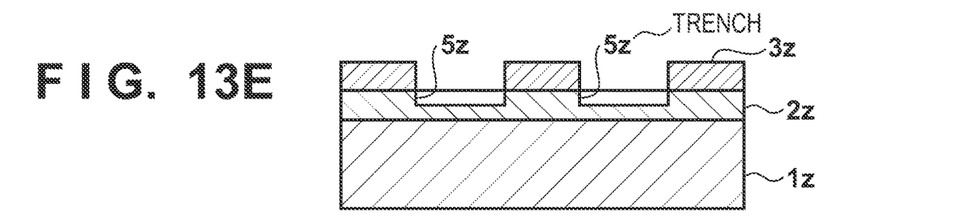
Figure 13F:
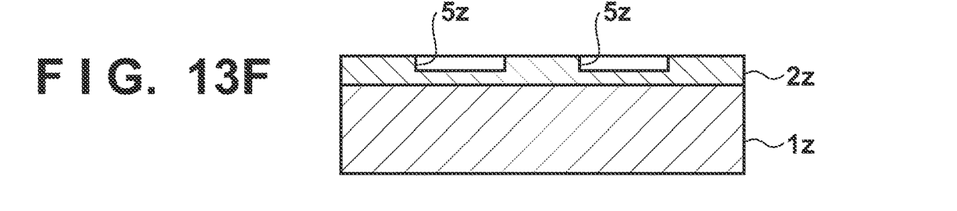

As shown in FIG. 13E, out of the surface of the processing target material $2z$, portions without any cured product or portions where the cured products remain thin are removed and become trenches $5z$ by performing etching using the pattern of the cured product as an etching resistant mask. As shown in FIG. 13F, an article having the trenches $5z$ formed in the surface of the processing target material $2z$ can be obtained by removing the pattern of the cured product. The pattern of the cured product is removed here. However, the pattern of the cured product may be used as, for example, an interlayer dielectric film included in the semiconductor element or the like, that is, the constituent member of the article without removing it after processing.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-146802, filed Jul. 28, 2017, which is hereby incorporated by reference herein in its entirety.

What is claimed is:

1. An imprint apparatus that forms a pattern on a substrate by bringing a mold into contact with an imprint material arranged on the substrate and curing the imprint material, the apparatus comprising:

a mold holder configured to hold the mold;
a substrate holder configured to hold the substrate;
a dispenser configured to arrange the imprint material on the substrate; and
a scope configured to capture an image of a mark,
wherein the substrate holder includes a reference plate which has a reference mark whose image is captured by the scope, the dispenser is arranged in a first direction when viewed from the mold holder,
wherein the substrate holder has two sides parallel to the first direction and two sides parallel to a second direction perpendicular to the first direction, and the reference plate is arranged between a center of the substrate holder and a corner of the substrate holder, which is located in the first direction when viewed from a virtual straight line which is parallel to the second direction and passes through the center of the substrate holder, and
wherein no reference plate having a reference mark is arranged between the virtual straight line and an edge of the substrate holder, which is located in an opposite direction of the first direction when viewed from the virtual straight line.

2. The apparatus according to claim 1, wherein the substrate holder has a rectangular shape which has the two sides parallel to the first direction and the two sides parallel to the second direction.

3. The apparatus according to claim 1, wherein the substrate holder is driven so the reference plate does not face the mold between pattern formation for a first shot region where a pattern is formed first out of a plurality of shot regions of the substrate and pattern formation for a final shot region where a pattern is formed finally out of the plurality of shot regions of the substrate.

4. The apparatus according to claim 3, wherein the pattern formation for the first shot region includes at least an arrangement of the imprint material for the first shot region, contact between the imprint material and the mold in the first shot region, and curing of the imprint material in the first shot region.

5. The apparatus according to claim 1, wherein the mold includes a pattern region having a pattern to be transferred to the imprint material arranged on the substrate, and the reference plate does not face the mold in even a case in which the pattern region is positioned with respect to any of the plurality of shot regions of the substrate.

6. The apparatus according to claim 5, wherein the mold includes a peripheral region configured to surround the pattern region, and the reference plate does not face the peripheral region of the mold in even a case in which the pattern region is positioned with respect to any of the plurality of shot regions of the substrate.

7. The apparatus according to claim 1, further comprising a charge removing device configured to reduce a charge amount of the mold, wherein a process in which the scope captures an image of the reference plate via the mold is performed after the charge removing device reduces the charge amount of the mold.

8. The apparatus according to claim 1, wherein the reference mark includes a plurality of electrically conductive reflectors, and the plurality of electrically conductive reflectors are arranged so as not to point-contact each other.

9. The apparatus according to claim 8, wherein the reference mark includes a transparent electrically conductive film configured to cover the plurality of electrically conductive reflectors.

10. The apparatus according to claim 1, wherein the reference mark includes an electrically conductive reflector and a transparent electrically conductive film configured to cover the electrically conductive reflector.

11. An article manufacturing method comprising:
forming a pattern on a substrate by an imprint apparatus defined in claim 1; and
performing a process on the substrate on which the pattern has been formed in the forming,
wherein an article is manufactured from the substrate on which the process has been performed.

12. An imprint apparatus that forms a pattern on a substrate by bringing a mold into contact with an imprint material arranged on the substrate and curing the imprint material, the apparatus comprising:
a mold holder configured to hold the mold;
a substrate holder configured to hold the substrate;
a dispenser configured to arrange the imprint material on the substrate; and
a scope configured to capture an image of a mark,
wherein the substrate holder includes a reference plate which has a reference mark whose image is captured by the scope, and the reference mark includes an electrically conductive reflector and a transparent electrically conductive film configured to cover the electrically conductive reflector.

13. The apparatus according to claim 12, wherein the transparent electrically conductive film is formed from a film selected from a group consisting of an ITO film, an IZO film, and a TNO film.

14. The apparatus according to claim 12, wherein the transparent electrically conductive film is formed from an Al thin film.

15. An imprint method of forming a pattern on a substrate held by a substrate holder including a reference plate by bringing a mold into contact with an imprint material arranged on the substrate and curing the imprint material, the method comprising:
performing a process of arranging the imprint material for each of a plurality of shot regions of the substrate by a dispenser, bringing the mold into contact with the imprint material, and curing the imprint material,
wherein the substrate holder is driven so the reference plate does not face the mold from a start of the process to an end of the process,
wherein the dispenser is arranged in a first direction when viewed from the mold holder,
wherein the substrate holder has a rectangular shape which has two sides parallel to the first direction and two sides parallel to a second direction perpendicular to the first direction, and the reference plate is arranged between a center of the substrate holder and an apex of the rectangular shape, which is located in the first direction when viewed from a virtual straight line which is parallel to the second direction and passes through the center of the substrate holder, and
wherein no reference plate is arranged between the virtual straight line and an edge of the substrate holder, which is located in an opposite direction of the first direction when viewed from the virtual straight line.

* * * * *